United States Patent [19]

Moriyama et al.

[11] 4,358,198

[45] Nov. 9, 1982

[54] APPARATUS FOR MOVING TABLE ON STAGE

[75] Inventors: Shigeo Moriyama, Hachioji; Tatsuo Harada, Fuchu; Masaaki Ito, Kokubunji, all of Japan

[73] Assignee: Hitachi, Ltd., Tokyo, Japan

[21] Appl. No.: 188,511

[22] Filed: Sep. 18, 1980

[30] Foreign Application Priority Data

Sep. 19, 1979 [JP] Japan ................... 54-119422

[51] Int. Cl.³ ................................ G03B 27/42
[52] U.S. Cl. ...................... 355/53; 355/54; 355/86; 355/95
[58] Field of Search .............. 355/53, 54, 86, 95; 252/12; 308/3 R, 3.8, 5 R, 6 R, 173, 241, DIG. 9; 409/219; 269/289 R

[56] References Cited

U.S. PATENT DOCUMENTS

| | | | |
|---|---|---|---|
| 3,472,591 | 10/1969 | Frohlich | 355/53 |
| 3,498,711 | 3/1970 | Ables et al. | 355/53 |
| 3,903,536 | 9/1975 | Westerberg | 355/53 X |
| 3,998,546 | 12/1976 | Wally, Jr. et al. | 355/53 |
| 4,189,230 | 2/1980 | Zasio | 355/53 X |
| 4,285,592 | 8/1981 | Sassenberg | 355/53 |

FOREIGN PATENT DOCUMENTS 50-21233  7/1975  Japan .

*Primary Examiner*—Richard A. Wintercorn
*Attorney, Agent, or Firm*—Antonelli, Terry & Wands

[57] ABSTRACT

An apparatus for moving a table or a stage having movable parts adapted to be guided by guide rail means slidingly and rectilinearly. At least the movable parts are made of a non-iron light metal material. The sliding surfaces of the movable parts making sliding contact with the guide rail means are made of a self-lubricating material, while the sliding surfaces of the guide rail means making sliding contact with the movable parts are made of a material having a higher hardness and wear resistance than the non-iron light metal material, so that the weight of at least the movable parts is reduced to decrease the weight of the apparatus as a whole.

7 Claims, 2 Drawing Figures

APPARATUS FOR MOVING TABLE ON STAGE

BACKGROUND OF THE INVENTION

The present invention relates to an apparatus for producing semiconductors such as an apparatus for moving a table or stage which is used for moving the specimen in a step and repeat camera, reduction projection aligner system or the like.

Generally, in such an apparatus, an integrated circuit pattern is projected and printed opto-photographically on a mask plate or a wafer coated with a photo resist. It is, however, impossible to effect the printing over the entire surface of the mask plate or the wafer at once due to a restriction concerning the image area of the projection lens.

This type of apparatus, therefore, incorporates an apparatus for moving a table or stage (precise X-Y table) to which adhered is the mask plate or the wafer, and printing of the integrated circuit pattern is effected over the entire area of the mask plate or the wafer through a two-dimensional stepping motion in X and Y directions.

In the production of the integrated circuit, it is required to superpose a multiplicity of different circuit patterns, usually 8 to 12 patterns, in layers on a single wafer at a registration accuracy of about 0.2 μm. This means that an equivalent or higher precision is required for the position control of the X-Y table. In addition, there is a demand for a high-speed positioning of the X-Y table to meet the requirement for the improvement in productivity.

To this end, in the X-Y table of the kind described, ball and roller bearing guide using rolling members such as balls and rollers or an air bearing guide has been used as the guide for the rectilinear motion of the X-Y table.

The ball and roller bearing guide, however, has to be fabricated with a severe selection and uniformity of the rolling members and must be worked with high precision, in order to achieve the required high accuracy of movement of the X-Y table. Thus, the production is not easy and it is quite difficult to maintain the initial accuracy of movement over a long period of use. The use of the air bearing guide is accompanied with a problem that a considerably long vibration settling time is required partly because of the increased mass of the movable part as a result of increased size of the mechanism as a whole, and partly because of an extremely small friction loss, although it affords a comparatively high accuracy of guiding operation and a good endurance. Thus, the air bearing guide is not suited for the high-speed positioning. Furthermore, there is another problem in these conventional arrangements that the material is limited due to the stress concentration and distortion force applied to the constituents, to hinder the reduction of weight of the movable parts which is one of the requisites for the high-speed positioning operation.

SUMMARY OF THE INVENTION

Under these circumstances, the present invention aims at providing an apparatus for moving a table or a stage, capable of performing a high-speed positioning while preserving a high guiding accuracy.

In order to achieve this object, according to the invention, there is provided an apparatus for moving a table or a stage comprising a base, first guide rail means laid on the base, first table means adapted to be guided linearly and slidingly in a predetermined direction by the first guide rail means, second guide rail means laid on the first table means and a second table means adapted to be guided linearly and slidingly in the direction determined by the second guide rail means, wherein the sliding parts of the first and second table means respectively making sliding contacts with the first and second guide rail means are made of a self-lubricating material, and the sliding surfaces of the first and second guide rail means respectively making sliding contact with the first and the second table means are made of a material having a higher hardness and wear resistance than the material of the first and the second table means.

DESCRIPTION OF THE PREFERRED EMBODIMENTS

The invention will be fully described hereinunder with reference to the accompanying drawings through its preferred form.

Figure 1:
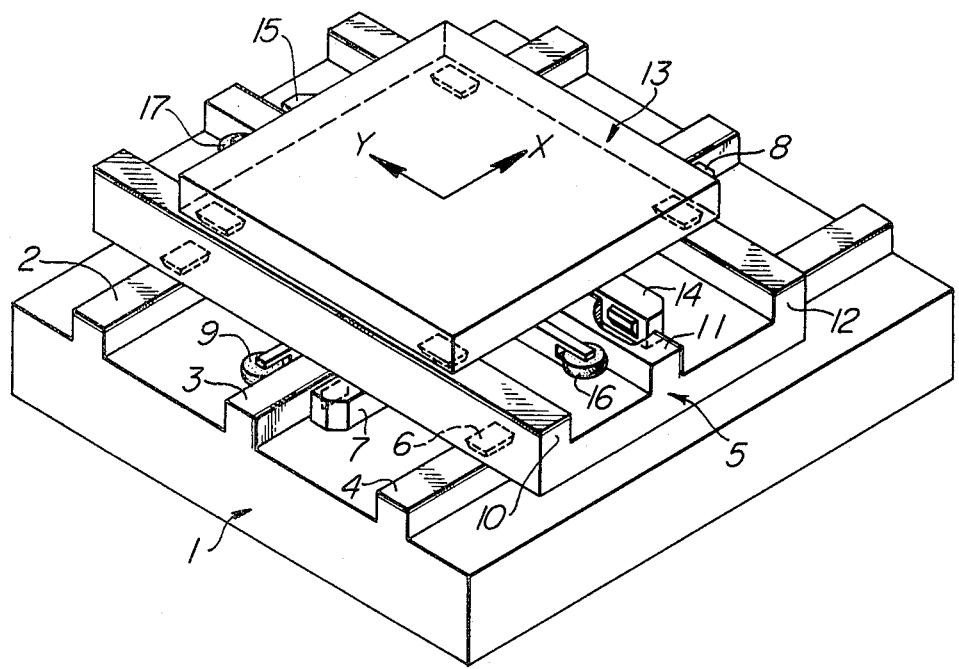
FIG. 1 shows an apparatus for moving a table or a stage constructed in accordance with an embodiment of the invention.

Referring first to FIG. 1 which is a perspective view of an apparatus constructed in accordance with an embodiment of the invention, three guide rails 2,3,4 are laid on the base generally designated by the reference numeral 1. An X-table generally designated by the reference numeral 5 is bourne by the guide rails 2,4 and is adapted to slide along the latter. A slide surface member 6 made of a glass-fiber filled PTFE (polytetrafluoroethylene) is adhered to each of four points of the lower face of the X-table 5, so as to reduce the frictional resistance. Yaw sliders 7,8 are provided at the central portion of the X-table 5 and are pressed against the sides of the guide rail 3 by means of a roller 9 which is pre-loaded by a leaf spring at a force of, for example, about 4 Kg, so that the X-table 5 makes a rectilinear motion in the X direction along the guide rail 3.

Three Y-axis guide rails 10,11,12 are laid on the X-table 5. A Y-table generally designated by the reference numeral 13 has Yaw sliders 14,15 and rollers 16,17 which cooperate with each other in clamping the guide rail 11 to guide the rectilinear motion of the Y-table 13 in the Y direction.

It will be understood that the Y-table 13 can make two-dimensional movement in X and Y directions. Hitherto, in view of the necessity for the wear resistance or the like reason, the guide rails 2,3,4 and 10,11,12 along which the sliders slide have been made from steel or the like material. This goes quite contrary to the reduction of the weight of the movable parts, which, as mentioned before, is an essential requisite for the high-speed positioning. The guide rails 2,3,4 laid on the base 1, however, need not always be of reduced weight, provided that they are held stationarily on the base 1.

The invention is intended for overcoming this problem by reducing the weights of the guide rail means, X and Y-tables and other movable parts.

Figure 2:
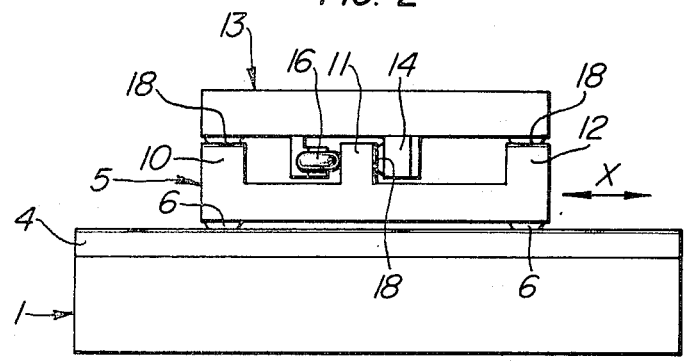
FIG. 2 is an end view of the apparatus shown in FIG. 1 as viewed in the direction of Y axis.

FIG. 2 is an end view of the apparatus shown in FIG. 1 as viewed in the direction of Y-axis.

The guide rails 10,11 and 12 are constituted by a member integral with the X-table 5. The material is, for example, duralumin for reducing the weight of the movable part. The Y-table 13 is made of a similar material as the X-table 5. The sliding surface 18 of the guide rail is plated for example with hard chromium so as to improve the wear resistance and to lower the friction coefficient of the sliding surface. The friction coefficient of the chromium-plated surface is about 0.15 which is about a half of that of the duralumin which exhibits a friction coefficient of about 0.3.

It is not essential that the guide rail means are formed integrally with the base or the X-table. Also, the provision of three rails in each guide rail means is not essential. All what is required for the guide rail means is that the tables are rectilinearly guided in a plane and, more specifically, that the tube movement of the Yaw sliders is limited within a plane. The use of the duralumin as the material of the movable parts such as guide rail means, X-table, Y-table and the like is not exclusive, and these movable parts may be constituted by other materials capable of achieving the reduction of weight, e.g. aluminum, aluminum alloy, magnesium, magnesium alloy, titanium, titanium alloy and so forth. Thus, any non-iron light metal can be used as the material.

Other materials than chromium, such as nickel or the like, can suitably be used as the surface material of the guide rails by an electric plating. Various metals and alloys such as iron, stainless steel and the like, and even ceramics can be used as the surface material, if a metalllization method is used for coating the sliding surface of the guide rails. The use of the above-mentioned materials, however, is not exclusive. Namely, it is necessary that a layer is formed on the sliding surface of the guide rail with a material having higher hardness and wear resistance than the materials constituting the X and Y-tables and other movable parts.

It is also possible to use polyimide resin, polyethylene resin, nylon and so forth as the material of the slide surface member, besides the aforementioned PTFE reinforced with glass fibers. The use of such macromolecule materials, however, is not exclusive and any other material having a self-lubricating nature can be used as the material of the slide surface member.

As has been described, according to the invention, the weight of the movable parts can be reduced to satisfy one of the requisites for the high-speed positioning, thanks to the use of a soft and light material as the material of the guide rails.

In addition, since the materials of the tables, the surface materials of the guide rails and the materials of the slide surfaces can be easily formed from a non-magnetic material such as duralumin, chromium-plating film and other macromolecule material, the apparatus of the invention can advantageously be applied not only to the described apparatus for the production of semiconductor device but also to the apparatus handling electron beams, such as apparatus for electron-beam lithography, electron microscope and so forth.

What is claimed is:

1. An apparatus for moving a table or a stage comprising: a base; first guide rail means laid on said base; first table means adapted to be guided by said first guide rail means slidingly and rectilinearly in a predetermined direction by said first guide rail means; second guide rail means laid on said first table means; and a second table means adapted to be guided slidingly and rectilinearly in the direction determined by said second guide rail means; wherein sliding parrts of said first and second table means respectively making sliding contact with said first and second guide rail means are made of a material having a self-lubricating nature, and wherein the sliding surfaces of said first and second guide rail means respectively making sliding contact with said first and second table means are formed of a material having a higher hardness and wear resistance than the material constituting said first and second table means.

2. An apparatus as claimed in claim 1, wherein at least said first and second table means and said second guide rail means are made of a non-iron light metal material.

3. An apparatus as claimed in claim 1 or 2, wherein the sliding surfaces of said first and second table means respectively making sliding contact with said first and second guide rail means are made of a macromolecule material.

4. An apparatus as claimed in claim 3, wherein said first and second table means are respectively made of at least one non-iron light metal material selected from a group consisting of aluminum, aluminum alloy, magensium, magnesium alloy, titanium and titanium alloy.

5. An apparatus as claimed in claim 4, wherein said sliding surfaces of said first and second guide rail means respectively making sliding contact with said first and second table means are plated with chromium over the entire area thereof.

6. An apparatus as claimed in claim 5, wherein the sliding surfaces of said first and second table means respectively making sliding contact with said first and second guide rail means are constituted by thin plates made of a glass-fiber filled polytetrafluoroethylene.

7. An apparatus for moving a table or a stage comprising: a base; first guide rails laid on said base; an X-table adapted to be guided slidingly and rectilinearly in X direction by means of said first guide rail; second guide rails laid on said X-table; and a Y-table adapted to be guided slidingly and rectilinearly by said second guide rails in the Y direction; wherein at least said X and Y-tables and said second guide rails are made of non-iron light metal material, wherein the sliding parts of said X and Y-tables respectively making sliding contact with said first and second guide rails are made of a macromolecule material having a self-lubricating nature, and wherein the sliding surfaces of said first and second guide rails respectively making sliding contact with said X and Y-tables are made of a material having a higher hardness and wear resistance than said non-iron light metal material.

* * * * *